United States Patent
Boisvert et al.

(10) Patent No.: US 8,987,129 B2
(45) Date of Patent: Mar. 24, 2015

(54) GROUP V DOPING OF GAAS-BASED LAYERS TO IMPROVE RADIATION TOLERANCE OF SOLAR CELLS

(71) Applicants: Joseph C. Boisvert, Thousand Oaks, CA (US); Christopher M. Fetzer, Valencia, CA (US)

(72) Inventors: Joseph C. Boisvert, Thousand Oaks, CA (US); Christopher M. Fetzer, Valencia, CA (US)

(73) Assignee: The Boeing Company, Chicago, IL (US)

( * ) Notice: Subject to any disclaimer, the term of this patent is extended or adjusted under 35 U.S.C. 154(b) by 330 days.

(21) Appl. No.: 13/627,481

(22) Filed: Sep. 26, 2012

(65) Prior Publication Data
US 2014/0084146 A1    Mar. 27, 2014

(51) Int. Cl.
*H01L 21/28* (2006.01)
*H01L 31/0687* (2012.01)

(52) U.S. Cl.
CPC ...... *H01L 31/0687* (2013.01); *H01L 31/06875* (2013.01); *Y02E 10/544* (2013.01)
USPC ...... 438/606; 438/93; 257/E21.172

(58) Field of Classification Search
USPC .............. 438/77, 606; 257/E21.365
See application file for complete search history.

(56) References Cited

U.S. PATENT DOCUMENTS

| | | | |
|---|---|---|---|
| 6,252,287 B1 | 6/2001 | Kurtz et al. |
| 6,281,426 B1 | 8/2001 | Olson et al. |
| 7,122,734 B2 | 10/2006 | Fetzer et al. |
| 7,126,052 B2 | 10/2006 | Fetzer et al. |
| 7,807,921 B2 | 10/2010 | Fetzer et al. |

*Primary Examiner* — Cheung Lee
(74) *Attorney, Agent, or Firm* — Smith Moore Leatherwood LLP

(57) ABSTRACT

Methods for improving the performance and lifetime of irradiated photovoltaic cells are disclosed, whereby Group-V elements, and preferably nitrogen, are used to dope semiconductor GaAs-based subcell alloys.

13 Claims, 3 Drawing Sheets

200
GROUP V DOPING OF GAAS-BASED LAYERS TO IMPROVE RADIATION TOLERANCE OF SOLAR CELLS

TECHNOLOGICAL FIELD

Aspects of the present disclosure are directed generally to energy generation devices and methods comprising the use of improved GaAs-based layers. More specifically, the present disclosure relates to novel doping regimens for use with GaAs-containing layers in photovoltaic cells.

BACKGROUND

Multi junction solar cells are known to convert solar energy to electricity. Such cells have found particular utility in various terrestrial and extra-terrestrial applications. Gallium Arsenide (GaAs) has been of interest for many years as a high-efficiency material for use in the manufacture of photovoltaic cells. The bandgap for GaAs at 1.42 eV at 300K is ideal for a photovoltaic device operating in the solar spectrum. Further, solar cells based on GaAs have been found to operate well at high temperatures and low temperatures, such as those found in outer space (for example, from about −180° C. to about 150° C.). Solar cells including multi junction III-V solar cells such as the state-of-the-art GaInP/GaAs/Ge triple junction solar cells employing GaAs-containing layers are known to undergo degrading performance during exposure to charged particle radiation, such as, for example, radiation that routinely occurs in space. One reason thought to contribute to such degradation is that interstitial arsenic atoms created by interaction with charged particle impacts to the crystal lattice in the GaAs layers are relatively slow in terms of diffusing to arsenic vacancies caused by the exposure to radiation. Therefore, once such a vacancy occurs, the arsenic atom in the GaAs has a relatively low probability of returning to a lattice site. The result is that the arsenic vacancy in the lattice acts as a trap for minority carrier recombination, thus decreasing the carrier lifetime and diffusion length of the minority carriers generated in the subcell structure. As diffusion lengths decrease, the overall performance of the solar cell degrades under increased energetic particle bombardment (radiation). As the arsenic is deemed easier to remove relative to other materials in the GaInP/GaAs/Ge stack, the GaAs subcell becomes the weakest structural point in the multi-junction under irradiation. As a result, triple junction solar cells employed, such as, for example, with space satellite applications, are presently limited in their performance and longevity by the properties of the GaAs middle cell. Even solar cells using metamorphic GaInAs alloys and similar GaInAsP and GaInAsSb alloys for lower bandgap subcells have been shown to degrade following irradiation.

At the atomic level, radiation impacting a GaAs cell layer causes displacements in the lattice structure. This disruption in the lattice results in a decrease of the minority carrier's lifetime, leading to a decrease in overall cell life. However, GaAs cells have been shown to have the capacity to repair themselves, albeit at a very slow rate, after sustaining damage due to irradiation.

One known solution for countering the effects of solar cell degradation due to exposure to radiation is to design a triple junction solar cell to insure that the GaAsP top subcell limits performance prior to radiation exposure. This state is typically referred to as "beginning of life" or BOL. After radiation exposure, both the GaInP top subcell and the GaAs middle subcell reach substantially equivalent current generation performance and are said to be "current matched" at "end-of-life", or EOL. Typically, as understood by one skilled in the art of space solar cell fabrication and design, this EOL condition is measured in equivalent 1-MeV electron fluences of between $3\times10^{14}$ and $3\times10^{15}$ charged particles per square centimeter as determined by the specific mission where the cells are employed. It should be noted that the terms BOL and EOL are understood by those skilled in the field to be associated with mission specific lifetime. Charged particle EOL, for example, can also be determined by proton damage. However, EOL is typically rated in equivalent damage by 1-MeV (1 mega-electron volt) energy electron damage. Such ratings are typically generated at 5e14 and 1e15 1-MeV electrons/$cm^2$ as the majority of missions range between 1e14 and 3e15 1-MeV electrons/$cm^3$. Additionally, cells can be engineered with ionized doping profiles to enable a field collection that does not change as a consequence of radiation, thus improving the minority carrier diffusion length regardless of irradiation.

Another known pathway employs thinner GaAs subcell layers. However, the use of thinner GaAs layers produces a trade-off in that thinner cells absorb less light/energy and are therefore inherently less efficient at "beginning-of-life". A further known step involves adding optical elements such as, for example reflectors to enable use of a thinner GaAs cell by allowing light a second "pass" through the thin GaAs subcell.

Accordingly, both "beginning-of-life" and "end-of-life" performance solutions currently available offer limited benefit since the GaAs-based subcells are susceptible to radiation damage. In next generation nJ multijunction solar cells (where n is 3, 4, 5 . . . or more junctions), the presently known attempts that address the radiation-sensitive GaAs subcell and its subsequent degradation become even less attractive and difficult to implement, as different subcells will degrade at differing rates. Doping profiles and thinner subcells only serve to worsen the problem, as the after-effects that occur in the GaAs-based layers are managed on minority carrier properties. Such presently known attempts at offering a solution to the problem are therefore limited relative to the amount of damage to the GaAs-based subcell layers that they are able to mitigate.

Additionally, there are trade-offs for thinner cells that diminish the "beginning-of-life" efficiency. For example, additional optical reflection involves complex epitaxial structures, such as distributed Bragg reflectors (DBR), or additional, and hence, complex and costly processing to turn the epitaxial stack into a fully functional cell. In general, efficiency is derived from a product of current output (number of electrons flowing) multiplied by their energy (voltage). As the cells are thinned to improve radiation tolerance, they typically absorb less light, thus generating less current. In tandem monolithic multi junction devices, such as, for example, the 3J GaInP/GaAs/Ge, the subcells are combined in series, meaning that their individual subcell voltages "add" and the current is limited by the lowest subcell. Therefore, as the GaAs subcell is thinned, it will produce less current and thereby reduce the current of the overall stack. This causes the overall efficiency to be limited by such current. Current balancing the subcells maximizes the overall efficiency of the stack by maintaining even production of current in all three subcells. This is typically achieved by making the GaAs layer optically thick (i.e. greater than a thickness of about 3 μm).

BOL efficiency is the un-irradiated (i.e. starting, or "beginning") efficiency of the device, such as, for example, in the case of a space vehicle, prior to launch into space). This BOL efficiency is therefore defined in testing as the starting point (zero particle fluence). Efficiency is the wall-plug efficiency or maximum electrical power output by the solar cell divided by the input power from the sun (a constant), which, in space, is taken as 1.353 W/cm$^2$.

BRIEF SUMMARY

Limiting the degradation of both lattice-matched and metamorphic subcells would be beneficial relative to increasing the performance, efficiency and useful life of metamorphic alloys useful in the manufacture of, for example, space solar cells. The present disclosure is directed to providing GaAs-based subcell layers with an amount of group-V element to improve performance of a solar cell after exposure to radiation, by providing for improved "end-of-life" cell performance, by significantly accelerating the annealing of crystalline defects introduced by radiation.

According to the present disclosure, doping GaAs (and similar GaAs-based alloys such as: GaInAs, GaAsSb, GaAsBi, GaInAsP, AlGaAs, GaInAsSb, AlGaInAs, AlInAs, AlGaAsSb, AlGaInAsSb and AlGaInAsP, and combinations thereof) contained within a multi junction or single junction photovoltaic device with another group-V element, such as, for example, nitrogen, limits the steady state density of group-V vacancies during high energy particle radiation, such as that encountered in space. The doped GaAs-based subcell alloy can be formed as an alloy of an entire subcell base and/or an emitter layer. In addition, a nitrogen-containing layer (or other group-V compound such as, for example, P, Sb, Bi, and combinations thereof) within a subcell base and/or an emitter layer may be provided. According to one variation, it is further contemplated that such a group-V-containing layer has a substantially equivalent band gap as the surrounding GaAs layers in the cell.

The disclosure contemplates a method for repairing radiation-induced damage to photovoltaic cells that comprise at least one layer of GaAs-containing material or similar alloys delineated above by 1) providing a photovoltaic cell comprising at least one GaAs-based subcell that comprises As vacancies upon exposure to radiation, 2) providing a material comprising an amount of group-V element, and 3) doping the GaAs-based subcell with the group-V element-containing material. For the purpose of this disclosure, doping is understood to mean a less than 1% concentration, typically measured in atoms/cm$^3$. The density of the materials in this disclosure is approximately $5 \times 10^{22}$ atoms/cm$^3$ and can be reliably measured down to $10^{14}$ atoms/cm$^3$.

In a further variation, the disclosure contemplates a method for repairing radiation-induced damage to photovoltaic cells comprising the steps of providing a photovoltaic cell made by sequentially growing semiconductor alloys that are lattice-matched to a Ge substrate, providing at least one subcell layer comprising a GaAs-based material having a lattice and a first current and voltage retention, providing at least one subcell layer material comprising an amount of group-V element, said group-V element subcell layer located proximate to the GaAs-based subcell layer, doping the GaAs-based subcell with a group-V element dopant, and providing an amount of the group-V element for migration into the GaAs-based material lattice substantially immediately after exposure of the photovoltaic cell to radiation. In addition, the GaAs-based subcell incorporating the group-V element dopant preferably achieves a second current and voltage retention after exposure to radiation that is greater than the first current and voltage retention of the GaAs-based subcell without the group-V element dopant, and the photovoltaic may comprise a multi junction cell or a single junction cell, or combinations thereof.

According to one alternative, the group-V element-containing material comprising a group-V element is selected from the group including nitrogen, phosphorous, arsenic, antimony, bismuth and combinations thereof, and is preferably nitrogen. Preferably the group-V element comprises a band gap that is substantially equivalent to the GaAs-based subcell. In a further variation the nitrogen is provided as a layer.

In a further variation, a group-V element-containing material is passivated into As interstitial spaces, or vacancies created in the GaAs-based subcells during and substantially immediately after exposure to radiation.

Another alternative relates to a method for repairing radiation damage in photovoltaic cells comprising GaAs-based subcells by 1) providing a photovoltaic cell comprising at least one GaAs-based subcell comprising As vacancies upon exposure to radiation, 2) providing a material comprising an amount of group-V element, and 3) incorporating the group-V element-containing material into the GaAs-based subcell.

Additionally, the present disclosure recognizes the advantageous incorporation of nitrogen into metamorphic GaInAs, such as the metamorphic GaInAs used as a subcell in high efficiency inverted metamorphic solar cells. Since the N—In bond is stronger than the In—As bond, nitrogen will preferentially substitute on vacant As sites left "open" from radiation damage. Nitrogen has about 100 times the diffusion coefficient than does arsenic, and it has now been determined that nitrogen will therefore travel much faster to migrate into the vacancies and "repair" radiation-induced defects.

According to a further variation the present disclosure relates to a method for repairing radiation-induced damage to single- or multi junction photovoltaic cells comprising the steps of providing a photovoltaic cell made by sequentially growing semiconductor alloys that are lattice-matched to a Ge substrate, providing at least one subcell layer comprising a GaAs-based material having a lattice and a first current retention, providing at least one subcell layer material comprising an amount of group-V element, said group-V element subcell layer located proximate to the GaAs-based subcell layer, doping the GaAs-based subcell with a group-V element dopant, and providing an amount of the group-V element for migration into the GaAs-based material lattice substantially immediately after exposure of the photovoltaic cell to radiation.

According to the disclosure, the GaAs-based subcell incorporating the group-V element dopant achieves a second current retention after exposure to radiation that is greater than the first current retention of the GaAs-based subcell without the group-V element dopant.

The group-V element subcell comprises a group-V element, such as, for example, nitrogen, phosphorous, arsenic, antimony, bismuth and combinations thereof, and the group-V element can be provided as a layer, and further comprises a band gap that is substantially equivalent to the GaAs-based subcell.

Still further, according to the present disclosure, upon exposure to radiation, especially in space, occurring As vacancies in the GaAs-based subcells lattice are passivated with at least one group-V element during and substantially immediately after exposure to radiation. The concentration of the group-V element incorporated into the GaAs-based subcell layer is preferably from about $1 \times 10^{13}$/cm$^3$ to about $1 \times 10^{18}$/cm$^3$. When the group-V element is nitrogen, it is preferably incorporated within the GaAs-based subcell layer from a source selected from the group including symmetric or nonsymmetric dimethyl hydrazine, trimethylhydrazine, nitrogen trifluoride, and combinations thereof.

In a further variation, the present disclosure relates to a method for repairing radiation damage in photovoltaic cells comprising GaAs-based subcells comprising the steps of providing a photovoltaic cell comprising at least one GaAs-based subcell comprising As interstitial spaces, or vacancies, upon exposure to radiation, providing a material comprising an amount of group-V element; and incorporating the group-V element-containing material into the GaAs subcell.

Still further, the present disclosure relates to a photovoltaic cell comprising at least one GaAs-based subcell comprising As vacancies upon exposure to radiation and a predetermined amount of group-V element-containing material incorporated into the GaAs-based subcell. The group-V element-containing material comprises at least one group-V element preferably selected from the group including nitrogen, phosphorous, arsenic, antimony, bismuth and combinations thereof, with nitrogen being particularly preferred. In one variation, the nitrogen is provided as a layer. In a further variation, the group-V element-containing material is incorporated into the GaAs-based subcell layer. In a still further variation, a group-V element-containing material is passivated into As interstitial spaces, or vacancies in the GaAs-based subcell during and substantially immediately after exposure to radiation.

The present disclosure contemplates the presence of an improved GaAs-based subcell or layer finding particular utility in various electronics, bipolar transistors, lasers, and photovoltaic cells, such as, for example, solar cells. More particularly, according to one variation, solar cells containing the improved GaAs-based subcells find particular utility in vehicles and other structures, especially manned or unmanned atmospheric vehicles, spacecraft, as well as missiles and satellites, etc.

BRIEF DESCRIPTION OF THE DRAWING(S)

Having thus described variations of the disclosure in general terms, reference will now be made to the accompanying drawings, which are not necessarily drawn to scale, and wherein:

DETAILED DESCRIPTION

The present disclosure is directed to solutions to modify the source of minority carrier property degradation of GaAs-based cells and subcells; namely, the formation of As vacancies under energy particle bombardment during exposure of the cells and subcells to radiation. As noted above, existing systems address the problem by anticipating the loss of current from GaAs-based subcells after radiation occurs, and seek to balance the radiated subcell performance against performance at "beginning-of-life". Other attempts recognize that radiation resistance can be optimized within the subcell by intentionally introducing ionized impurities, such as Zn, group-II or C, group-IV dopants to attain consistent minority carrier diffusion lengths (via induced electric fields). Additional device designs, such as optical reflectors, are used to "thin" the active area of the radiation damage-prone region, typically the base of a p-type material. Variations presented in this disclosure achieve improved results and accommodate the strengthening of the crystal lattice GaAs material. As a result, according to the present disclosure, the resulting current retention in the GaAs-based subcells after irradiation improves overall subcell performance (and, improves performance in the entire device, such as for example, in a solar cell incorporating the GaAs subcell) at both "beginning-of-life" and "end-of-life". According to the present disclosure, significantly improved results over known methods are achieved by directly altering the source of the lost performance by passivating As vacancies with group-V elements, such as, for example, nitrogen during and immediately after irradiation.

Figure 1:
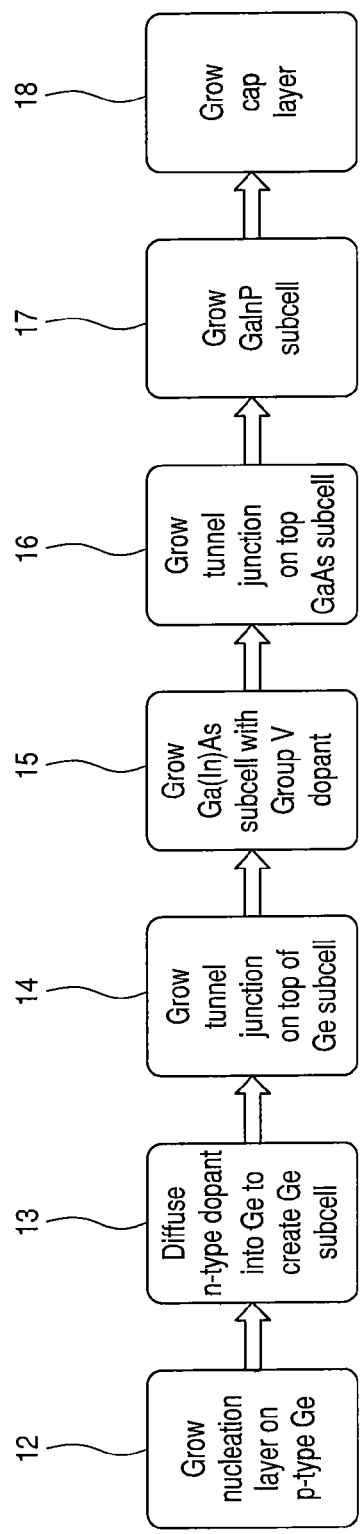
FIG. 1 is a flowchart showing one method of making a photovoltaic cell comprising a GaAs layer incorporating a group-V element-containing material.
Figure 2:
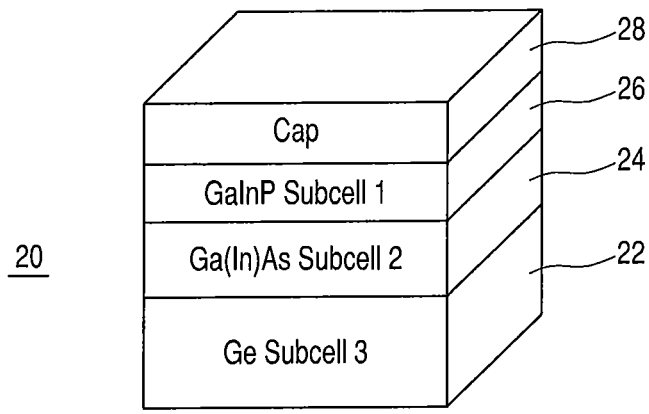
FIG. 2 is are schematic representations of a GaInP/GaAs/Ge photovoltaic cells showing the incorporation of GaAs-containing layers.

A multijunction solar cell growth process is shown in FIG. 1 and consists of sequentially growing semiconductor alloys that are lattice-matched to a germanium substrate. as is done for a triple junction solar cell that is the present state-of-the-art. According to one variation, a nucleation layer 12 is grown on a p-type Ge base. Diffuse n-type dopant is then provided into the Ge layer to create a Ge subcell 13. A tunnel junction is then grown on top of the Ge subcell 14. A GaInAs subcell with group-V dopant is then grown 15, and a tunnel junction is grown on top of the GeAs subcell 16. A GaInP subcell is then grown 17, followed by providing a cap layer 18. A triple junction lattice-matched solar cell 20 is shown schematically in FIG. 2, and comprises three subcells that are designed to convert different regions of the solar spectrum into electrical power. Layer 1 consists of a germanium subcell 22 that converts solar energy between about 900 nm and 1700 nm in wavelength into electrical power. Layer 2 consists of a Ga(In)As subcell (a "GaAs-based" cell) 24 that converts solar energy between about 650 nm and 900 nm into electrical power. Layer 3 is a GaInP subcell 26 that converts solar energy between about 300 nm and 650 nm into electrical energy. Layer 4 is a cap or contact layer 28 that provides a means to provide a low resistance metal contact to extract electrical current out of the multijunction solar cell with minimum loss of power.

Figure 3:
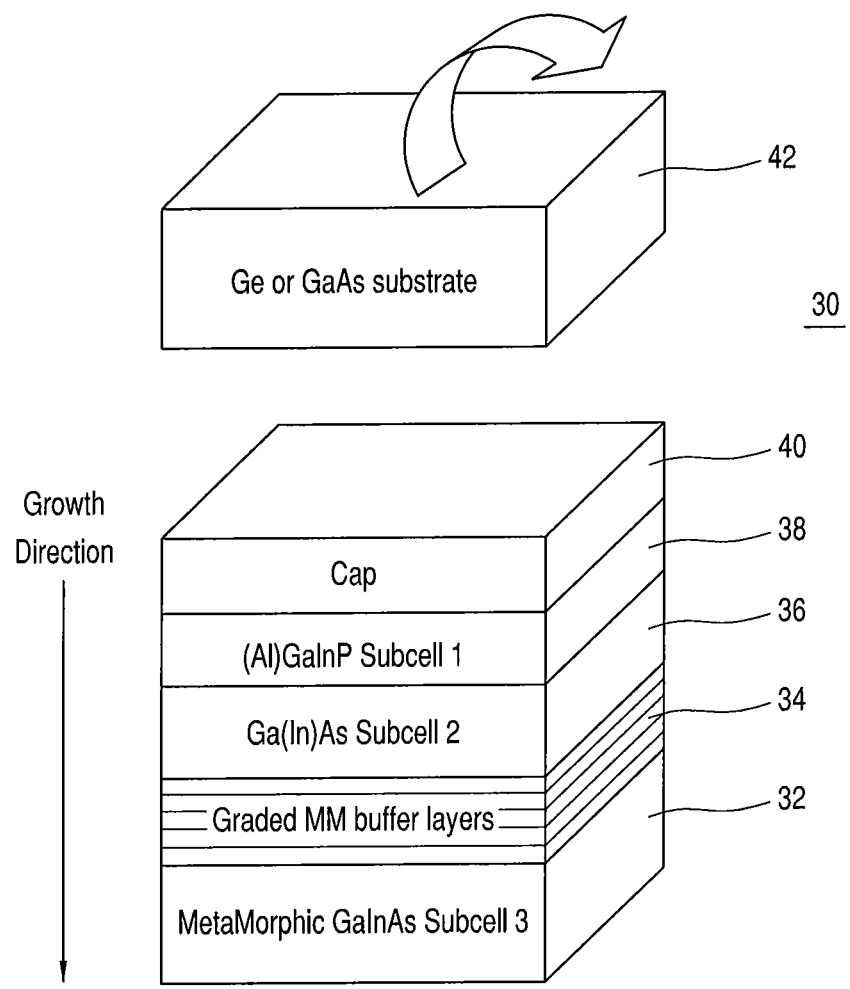
FIG. 3 is a schematic representations of a (Al)GaInP/Ga(In)As/GaInAs metamorphic photovoltaic cell showing the incorporation of GaAs-containing layers.

FIG. 3 displays another variation of a multijunction solar cell 30, called an Inverted MetaMorphic solar cell. In this variation, the solar cell 30 is grown in an inverted configuration to its final orientation. Layer 1 consists of a MetaMorphic GaInAs subcell (a "GaAs-based" cell) 32 that converts solar energy between about 900 nm and 1300 nm in wavelength into electrical power. Layer 2 consists of metamorphic buffer grading layers 34 that change the lattice constant of the semiconductor alloys from about 5.65 Å to about 5.75 Å which is necessary to accommodate the Layer 1 GaInAs alloy. Layer 3 consists of a Ga(In)As subcell (a "GaAs-based" cell) 36 that converts solar energy between about 650 nm and 900 nm into electrical power. Layer 4 is a GaInP subcell 38 that converts solar energy between about 300 nm and 650 nm into electrical energy. Layer 5 is a cap or contact layer 40 that provides a means to provide a low resistance metal contact to extract electrical current out of the multijunction solar cell with minimum loss of power. The stack comprising layers 1-5 is attached to a Ge or GaAs substrate 42.

According to another variation, semiconductor layers are grown sequentially in a Metal Organic Vapor Phase Epitaxial (MOVPE) reactor to form a solar cell. Nitrogen is incorporated within the GaAs-based cells through the use of known metalo-organic sources, such as, for example, symmetric or nonsymmetric dimethyl hydrazine, trimethylhydrazine, or nitrogen trifluoride, etc. The nitrogen level incorporated into the material is preferably present in an amount only of from about $1\times10^{13}$/cm$^3$ to about $1\times10^{18}$/cm$^3$. Additional elements along the group-V column of the periodic table are also contemplated as useful in similar concentration ranges, however, the use of nitrogen is particularly preferred.

Although the present disclosure and its variations and alternatives have predominantly been discussed relative to the manufacture and use of photovoltaic cells, more particularly solar cells, the present disclosure is also useful relative to the manufacture and use of bipolar transistors, lasers, etc. and other devices that comprise components having GaAs layers that may or may not be exposed to radiation during the course of their use. Such devices include but are not limited to parts designed to be positioned on the exterior or interior of atmospheric and aerospace vehicles and other objects and structures designed for use in space or other upper-atmosphere environments, such as, for example manned or unmanned vehicles and objects. Contemplated objects include, but are not limited to vehicles, such as, for example, aircraft, spacecraft, satellites, rockets, missiles, etc. and therefore include manned and unmanned aircraft, spacecraft, terrestrial, non-terrestrial, and even surface and sub-surface water-borne vehicles and objects.

While the preferred variations and alternatives of the present disclosure have been illustrated and described, it will be appreciated that various changes and substitutions can be made therein without departing from the spirit and scope of the disclosure. Accordingly, the scope of the disclosure should only be limited by the accompanying claims and equivalents thereof.

We claim:

1. A method for repairing radiation-induced damage to photovoltaic cells comprising the steps of:
   providing a photovoltaic cell made by sequentially growing semiconductor alloys that are lattice-matched to a Ge substrate;
   providing at least one subcell layer comprising a GaAs-based material having a lattice and a first current and voltage retention;
   providing at least one subcell layer material comprising an amount of group-V element, said group-V element subcell layer located proximate to the GaAs-based subcell layer;
   doping the GaAs-based subcell with a group-V element dopant; and
   providing an amount of the group-V element for migration into the GaAs-based material lattice substantially immediately after exposure of the photovoltaic cell to radiation.

2. The method of claim 1, wherein the GaAs-based subcell incorporating the group-V element dopant achieves a second current and voltage retention after exposure to radiation that is greater than the first current and voltage retention of the GaAs-based subcell without the group-V element dopant.

3. The method of claim 1, wherein the photovoltaic cell comprises a multi junction cell.

4. The method of claim 1, wherein the photovoltaic cell comprises a single junction cell.

5. The method of claim 1, wherein the group-V element subcell comprises at least one group-V element.

6. The method of claim 5, wherein the group-V element is provided as a layer.

7. The method of claim 5, wherein the concentration of nitrogen incorporated into the GaAs-based subcell layer is from about $1\times10^{13}$/cm$^3$ to about $1\times10^{18}$/cm$^3$.

8. The method of claim 5, wherein nitrogen is incorporated within the GaAs-based layer from a source selected from the group consisting of: symmetric or nonsymmetric dimethyl hydrazine, trimethylhydrazine, nitrogen trifluoride, and combinations thereof.

9. The method of claim 1, wherein the group-V-element subcell comprises nitrogen.

10. The method of claim 1, wherein the group-V element subcell comprises a band gap that is substantially equivalent to the GaAs-based subcell.

11. The method of claim 1, wherein the semiconductor alloy is selected from the group consisting of: GaAs, GaInAs, GaAsSb, GaAsBi, GaInAsP, AlGaAs, GaInAsSb, AlGaInAs, AlInAs, AlGaAsSb, AlGaInAsSb, AlGaInAsP, and combinations thereof.

12. The method of claim 1, further comprising the step of:
   passivating As vacancies in the GaAs-based subcells resulting from exposure to radiation with at least one group-V element during and substantially immediately after exposure to radiation.

13. A method for repairing radiation damage in photovoltaic cells comprising GaAs-based subcells comprising the steps of:
   providing a photovoltaic cell comprising at least one GaAs-based subcell comprising As vacancies upon exposure to radiation;
   providing a material comprising an amount of group-V element; and
   incorporating the group-V element-containing material into the GaAs subcell.

* * * * *